United States Patent
D'Evelyn et al.

(10) Patent No.: US 8,747,963 B2
(45) Date of Patent: Jun. 10, 2014

(54) APPARATUS AND METHOD FOR DIAMOND FILM GROWTH

(75) Inventors: Mark Phillip D'Evelyn, Santa Barbara, CA (US); John Dewey Blouch, Glenville, NY (US); Ludwig Christian Haber, Rutland, MA (US); Hongying Peng, Schenectady, NY (US); David Dils, Benbrook, TX (US); Svetlana Selezneva, Schenectady, NY (US); Kristi Jean Narang, Voorheesville, NY (US)

(73) Assignee: Lockheed Martin Corporation, Bethesda, MD (US)

(*) Notice: Subject to any disclaimer, the term of this patent is extended or adjusted under 35 U.S.C. 154(b) by 826 days.

(21) Appl. No.: 12/359,083

(22) Filed: Jan. 23, 2009

(65) Prior Publication Data

US 2010/0189924 A1    Jul. 29, 2010

(51) Int. Cl.
| | |
|---|---|
| C23C 16/00 | (2006.01) |
| C23C 16/27 | (2006.01) |
| C23C 16/455 | (2006.01) |
| C23C 16/511 | (2006.01) |
| H01J 37/32 | (2006.01) |

(52) U.S. Cl.
CPC ......... *C23C 16/274* (2013.01); *C23C 16/45578* (2013.01); *C23C 16/45563* (2013.01); *C23C 16/511* (2013.01); *H01J 37/32192* (2013.01)
USPC ...... 427/575; 427/569; 427/249.7; 427/249.1

(58) Field of Classification Search
USPC ..................................... 427/248.1, 575, 249.8
See application file for complete search history.

(56) References Cited

U.S. PATENT DOCUMENTS

| | | | |
|---|---|---|---|
| 4,148,275 A | 4/1979 | Benden | |
| 4,434,188 A * | 2/1984 | Kamo et al. | 427/575 |
| 4,767,608 A * | 8/1988 | Matsumoto et al. | 423/446 |
| 4,869,924 A * | 9/1989 | Ito | 427/575 |
| 4,984,534 A * | 1/1991 | Ito et al. | 118/723 MW |
| 5,028,451 A * | 7/1991 | Ito et al. | 427/577 |
| 5,054,421 A | 10/1991 | Ito | |
| 5,134,965 A * | 8/1992 | Tokuda et al. | 118/723 MW |
| 5,169,676 A * | 12/1992 | Moran et al. | 427/577 |
| 5,175,019 A * | 12/1992 | Purdes et al. | 427/573 |

(Continued)

OTHER PUBLICATIONS

Webpage for Seko Technotron USA, showing Model AX6550/6560, "Microwave Plasma Reactors, Systems, Sources," found at www.sekicvdsolutions.com, dated Aug. 8, 2007.

(Continued)

*Primary Examiner* — David Turocy
(74) *Attorney, Agent, or Firm* — Bracewell & Giuliani LLP

(57) ABSTRACT

An apparatus and methods for forming a diamond film, are provided. An example of an apparatus for forming a diamond film includes an electrodeless microwave plasma reactor having a microwave plasma chamber configured to contain a substrate and to contain a reactant gas excited by microwaves to generate a microwave plasma discharge. Gas injection ports extend through an outer wall of the plasma chamber at a location upstream of the plasma discharge and above the substrate. Gas jet injection nozzles interface with the gas injection ports and are configured to form a directed gas stream of reactant gas having sufficient kinetic energy to disturb a boundary layer above an operational surface of the substrate to establish a convective transfer of the film material to the operational surface of the substrate.

23 Claims, 4 Drawing Sheets

(56) References Cited

U.S. PATENT DOCUMENTS

| | | | |
|---|---|---|---|
| 5,271,971 A * | 12/1993 | Herb et al. | 427/577 |
| 5,324,563 A | 6/1994 | Ovshinsky et al. | |
| 5,445,887 A | 8/1995 | Casti | |
| 5,589,002 A * | 12/1996 | Su | 118/723 E |
| 6,592,947 B1 | 7/2003 | McCane | |
| 6,837,935 B2 | 1/2005 | Meguro | |
| 6,858,078 B2 * | 2/2005 | Hemley et al. | 117/68 |
| 7,125,586 B2 | 10/2006 | Van Steenkiste | |
| 2002/0005170 A1 * | 1/2002 | Meguro et al. | 118/723 MW |
| 2003/0070620 A1 * | 4/2003 | Cooperberg et al. | 118/723 AN |
| 2003/0136518 A1 * | 7/2003 | Shanov et al. | 156/345.41 |
| 2003/0192645 A1 * | 10/2003 | Liu et al. | 156/345.33 |
| 2006/0275554 A1 | 12/2006 | Zhao et al. | |

OTHER PUBLICATIONS

S.M. Gasworth, "Model for the hydrogen atom flux developer in a microwave plasma jet under diamond synthesis conditions," found in Applications of Diamond Films and Related Materials, Y.Tzeng, M. Yoshikawa, M. Murakawa, A. Feldman (Editors); Elsevier Science Publishers B.V. 1991, pp. 597-601.

Goodwin Butler, Theory of Diamond CVD, Handbook of Industrial Diamonds, ed. M.A. Prelas, et al., 1998, p. 542, "Diffusive vs. Convective Transport".

* cited by examiner

Fig. 4
(Prior Art)

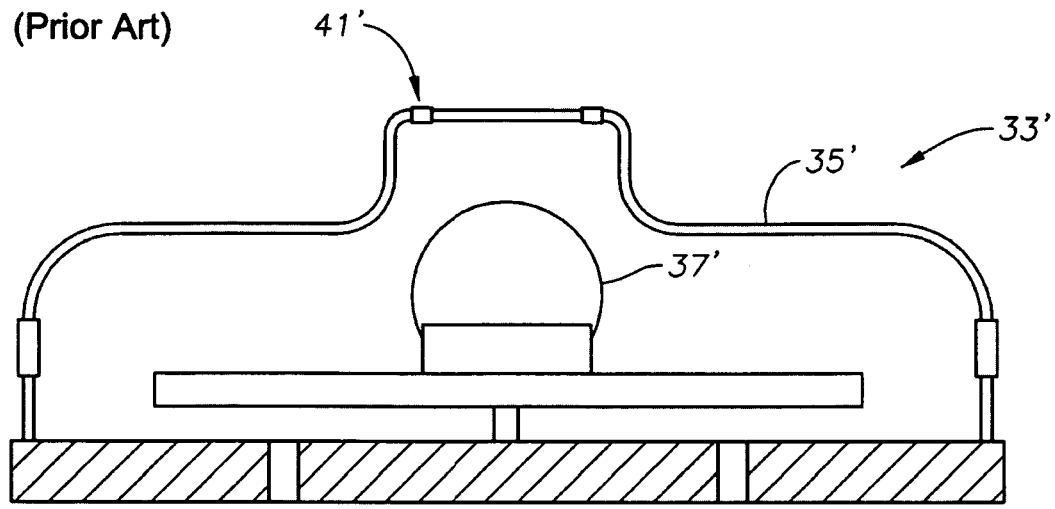

| Orient each of the in-plane injection nozzles at a substantially same acute angle with respect to the operational surface of the substrate | — 121 |

↓

| Interface an additional injection nozzle with a gas injection port upstream of the microwave plasma discharge and above the substrate | — 123 |

↓

| Orient the additional injection nozzle at an angle approximately normal to the operational surface of the substrate | — 125 |

Fig. 7

APPARATUS AND METHOD FOR DIAMOND FILM GROWTH

BACKGROUND OF THE INVENTION

1. Field of the Invention

The present invention relates generally to systems for growing diamond films, which employ electrodeless microwave reactor technology. More specifically, the present invention relates to systems, apparatus, and methods of employing electrodeless microwave plasma chemical vapor deposition (CVD) to produce high quality CVD diamond films.

2. Description of the Related Art

Chemical vapor deposition or CVD is a chemical process that can be used to produce various solid materials. In a typical plasma-enhanced CVD process, a substrate contained within a reactor chamber is exposed to a plasma discharge which activates one or more precursor gases and/or a carrier gas that reacts and/or decomposes on the substrate surface to produce the desired deposit. Plasma-enhanced CVD processes are often used to produce thin diamond films. CVD diamond has many outstanding properties, including hardness, stiffness, optical transparency, and high thermal conductivity. Because of the unusual process requirements for successful deposition of diamond films, e.g., the need for a high concentration of atomic hydrogen in order to stabilize the diamond structure over graphite and to drive the surface reactions involved in diamond deposition, diamond CVD reactors tend to be highly specialized. For example, microwave plasma reactors for diamond deposition tend to operate at higher gas pressures than many other plasma-based CVD processes and have much higher plasma power densities.

Various types of such apparatus (e.g., "reactors") and methods exist for growing CVD diamond films from a vapor phase. Although many types of CVD techniques have been used for the growth of diamond films, the two primary techniques used for high quality thin film diamond are hot filament growth and plasma-enhanced growth. Typical plasma sources for plasma-enhanced CVD diamond growth are microwave discharge, RF thermal discharge, and DC arc discharge. The primary types of reactors employed include those that utilize electrodes to form plasma from gas, and those that do not One type of device that utilizes electrodes is described in U.S. Pat. No. 5,054,421 by Ito et al. titled "Substrate Cleaning Device." The device can provide a relatively high rate of diamond deposition by employing an arc-jet plasma whereby gas is injected within a nozzle in which an arc is passing. The average gas temperature after passing the arc jet is significantly higher than can be achieved by thermal activation methods such as hot filament CVD. In an arc-jet flow, the velocity of gas flux is very high (~1-10 km/sec), which results from the expansion or acceleration process. The high velocity of the gas flux allows for a more efficient delivery of the reaction species to a substrate due to a reduced boundary layer thicknesses, and thus, results in a higher linear growth rate. Despite the high linear growth rate, it is typically difficult to produce high quality diamond using arc-jet deposition, and any production, thereof, is spatially limited to a small coating area. Those two disadvantages restrict its ability to be utilized in applications involving direct use of the large, free-standing diamond plates, such as, for example, heat sinks or optical windows.

Although reactors that utilize electrodes have their purpose, when attempted to be employed to produce "transparent" diamond films, they typically result in excessive contamination and degradation, and thus, are generally considered in industry to be unsuitable for such purpose. To grow high quality diamond thin and thick films, electrodeless plasma CVD methods, in general, and microwave plasma CVD at 2.45 GHz and 915 MHz, in particular, have certainly the highest potential for large scale industrial application. Especially, if contamination-free films are required, radio frequency and microwave plasma CVD are generally considered the only suitable methods available, with the later being much more power efficient. Accordingly, the conventional technique to grow high quality and uniform diamond thin films, especially over large substrate areas, is through use of microwave plasma CVD methods employed using an electrodeless microwave CVD diamond reactor, such as, for example, that described in U.S. Pat. No. 5,175,019 by Purdes et al., title "Method for Depositing a Thin Film," assigned to Texas Instruments Inc., Dallas Tex. An example of such device is provided by the ASTex PDS-19 CVD reactor marketed by Seki Technotron as Model No. AX6550.

Although key parameters to control diamond film quality and growth rate have strong interactions, such as, for example, microwave power density, substrate temperature, methane or other carbon precursor percentage, with respect to hydrogen ($H_2$) flow (gas flow) and reaction chamber pressure, etc.; in conventional microwave CVD diamond reactors, the hydrogen flow rate is typically kept relative low, e.g., typically within a range of approximately 50-600 standard cubic centimeters per minute (sccm), or so, and with a very low velocity or flux. As such, gas flow is believed to have limited or no interaction with those key parameters. According to conventional wisdom, the main purpose of the low hydrogen flux is to not disturb the combustion chemistry inside the plasma discharge created by the microwave, otherwise, growth species depositions, such as hydrogen atoms and methyl radicals, would have an uneven distribution over the substrate surface area and result in significant non-uniform growth of the diamond film.

As manufacturers of conventional electrodeless reactors inject gas gently and with low flow rates of gas to prevent convection, often going to considerable design lengths to minimize the gas velocity at the substrate and the uniformity of gas flow, the maximum growth rates that may be achieved in producing optical grade CVD diamond using such conventional microwave plasma CVD apparatus and methods are only approximately one to three microns per hour over a large diameter substrate. As such, the deposition cost to generate a 4 in. diameter millimeter thick substrate can typically cost upwards of approximately $30,000.

The inventors, therefore, have recognized the need for an apparatus and method of employing electrodeless microwave plasma CVD technology to produce high quality CVD diamond at a substantially improved high growth rate, e.g., that approaching or exceeding that attainable through use of an arc jet, while maintaining high quality, e.g., superior transparency or high thermal conductivity, along with high film uniformity, and at a substantially reduced production cost.

SUMMARY OF THE INVENTION

In view of the foregoing, various embodiments of the present invention provide an apparatus and method of employing electrodeless microwave plasma CVD technology to produce high quality CVD diamond at a substantially improved high growth rate, e.g., that approaching or exceeding that attainable through use of an arc jet, while maintaining high quality, e.g., superior transparency or high thermal conductivity, along with high film uniformity, and at a substantially reduced production cost. According to various embodiments of the present invention, this can be accomplished through use of the addition of kinetic energy to the gas flow and manipulation of the plasma discharge. Advantageously, adding convection, according to various embodiments of the present invention, can substantially increase the flux of desirable reactant species towards the substrate surface, enhancing growth rate to that approaching processes, such as that of the arc jet, while maintaining high quality and uniformity.

More specifically, an example of an apparatus for forming a diamond film, according to an embodiment of the present invention, includes an electrodeless microwave plasma reactor apparatus including a microwave plasma chamber, a microwave generator assembly in communication with the microwave plasma chamber to produce a microwave plasma discharge, and a discharge gas flow director assembly including at least one, but preferably a plurality of discharge gas flow directors (e.g., gas jet injection nozzles) positioned upstream of the location of the microwave plasma discharge, when generated. Advantageously, according to various embodiments of the gas injection nozzles of the discharge gas flow director assembly, the nozzles are configured to add substantial kinetic energy to the gas flow emanating from one or more of the gas injection nozzles to produce high quality CVD diamond at a substantially improved high growth rate, while maintaining high quality.

Another example of an apparatus for forming a diamond film, according an embodiment of the present invention, includes an electrodeless microwave plasma reactor having a microwave plasma chamber configured to contain a reactant gas excited by microwaves to generate a microwave plasma discharge, and configured to contain a substrate when affixed therein. The microwave plasma reactor can include a microwave generator assembly positioned in communication with the microwave plasma chamber to generate the microwave plasma discharge at a location of the substrate within the microwave plasma chamber, and a discharge gas flow director assembly connected to the microwave plasma chamber. In this exemplary embodiment, the discharge gas flow director assembly includes at least one, but preferably a plurality of discharge gas flow directors (e.g., gas jet nozzles) each configured to form a directed gas stream of reactant gas to interact with the microwave plasma discharge. According to the exemplary configuration, when utilizing multiple nozzles, each directed gas stream can be oriented to interact with at least one other directed gas stream and with the microwave plasma discharge when generated to thereby enhance the growth rate of diamond film on the substrate while maintaining substantial uniformity of the film.

Another example of an apparatus for forming a diamond film includes an electrodeless microwave plasma reactor having a microwave plasma chamber configured to contain a substrate and to contain a reactant gas excited by microwaves to generate a microwave plasma discharge. The microwave plasma chamber includes a plurality of gas injection ports each positioned through a proximal end portion of the chamber at a spaced apart location substantially upstream of the microwave plasma discharge when generated and above an operational surface of the substrate when operably positioned within the microwave plasma chamber. The reactor further includes a plurality of directed gas jet injection nozzles each interfaced with a respective one of the gas injection ports in the proximal end portion of the microwave plasma chamber and each configured to form a directed gas stream of gas having sufficient kinetic energy to substantially disturb a boundary layer above an operational surface of the substrate when operably positioned within the microwave plasma chamber to thereby establish a convective transfer of the film material to the operational surface of the substrate.

Various embodiments of the present invention also include a method of forming a diamond film. An example of such a method includes the step of configuring each of a plurality of directed gas jet injection nozzles to create a directed gas stream of reactant gas within a microwave plasma chamber of an electrodeless microwave plasma reactor to thereby enhance the growth rate of a film on an operational surface of a substrate while maintaining substantial uniformity of the film, and can include the step of orienting each directed gas stream to interact with at least one other directed gas stream and with a microwave plasma discharge when generated within the microwave plasma chamber to thereby further enhance growth rate of a film on an operational surface of a substrate while maintaining substantial uniformity of the film. The method also includes imparting substantial kinetic energy to each directed gas stream sufficient to disturb a boundary layer above the substrate to thereby increase an impingement rate of reactant material on the operational surface of the substrate. The increased impingement rate can result in a substantial increase in growth rate of deposited film material, i.e., the increase in convection directly results in an increase in growth rate. To this end, the method can further include controlling a combination of a flow rate of gas entering the microwave plasma chamber, a velocity of gas injected from each of the plurality of directed gas jet injection nozzles into the microwave plasma chamber, a temperature within the chamber, and a pressure within the chamber to thereby control a shape of the microwave plasma discharge and a concentration of reactant species in close proximity to the operational surface of the substrate, and thus, the deposition rate of the reactant material.

Advantageously, the effect of the plasma discharge being downstream of the gas nozzles, according to an embodiment of the present invention, is that the directed gas flow from the nozzles can affect a change on the plasma discharge to create unique growth conditions that show both good uniformity and increased growth rate as compared to a system without directed gas flow. Advantageously, the effect of the added kinetic energy, according to an embodiment of the present invention, is to substantially disturb the boundary layer above the substrate, increasing the impingement rate of atomic hydrogen H and growth species such as the methyl radical $CH_3$, acetylene $C_2H_2$, and ethynyl $C_2H$. Where current electrodeless microwave reactor manufacturers inject gas gently to minimize convection, using low flow rates of gas, various embodiments of the present invention advantageously employ directed gas flows at high flow rates, e.g., up to and exceeding 1 slm. Advantageously, the combined effects of the positioning of the microwave generator and the addition of kinetic energy, according to an embodiment of the present invention, can result in an increase in growth rate by a factor of 2 or 3 or more of deposited diamond diameter substrate at an equivalent substrate temperature and gas composition, and thus, reduce the production cost of a 4 in. diameter, 1.2 mm thick substrate, for example, from about $30,000 to about $5000 or less.

Advantageously, according to an embodiment of the present invention, optimization of such conditions can be provided through a unique selection of the location of the feed gas injection port(s), discharge gas flow directors, and exhaust gas pumping ports of the discharge chamber system. Further, advantageously, additional optimization considerations that can be employed can include the application of radially uniform feed gas injection and radially uniform pumping of the discharge gas. Further, according to an embodiment of an apparatus the injection ports and gas flow direction surfaces are designed to help improve the uniformity and shape of the discharge and ultimately the deposited film uniformity.

As a result of experimental testing of different nozzle configurations, achieving different flow patterns with the microwave plasma chamber, optimized nozzle configurations were found to not only improve growth rate at an unexpected level, but also to achieve reasonable uniformity on a flat substrate. Achieving high growth rate and good uniformity on a flat substrate is especially desirable for growing thick diamond films.

BRIEF DESCRIPTION OF THE DRAWINGS

So that the manner in which the features and advantages of the invention, as well as others which will become apparent, may be understood in more detail, a more particular description of the invention briefly summarized above may be had by reference to the embodiments thereof which are illustrated in the appended drawings, which form a part of this specification. It is to be noted, however, that the drawings illustrate only various embodiments of the invention and are therefore not to be considered limiting of the invention's scope as it may include other effective embodiments as well.

FIG. 4 is a schematic diagram of a conventional microwave plasma reactor; and

FIGS. 5-7 are schematic flow diagrams of a method of forming a diamond film according to an embodiment of the present invention.

DETAILED DESCRIPTION

Figure 1:
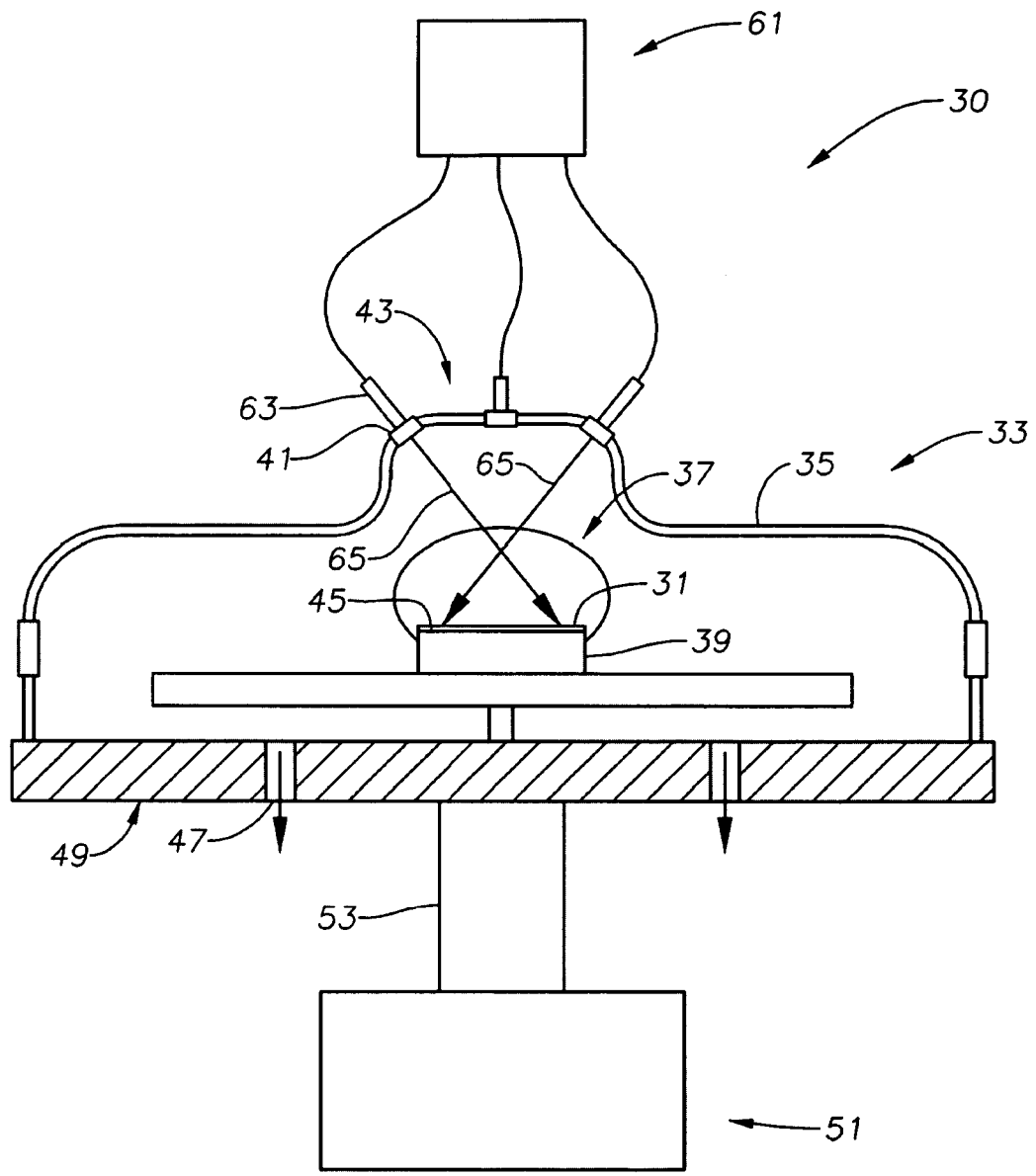
FIG. 1 is a schematic diagram of a general architecture of portions of an apparatus for forming a diamond film according to an embodiment of the present invention.

The present invention will now be described more fully hereinafter with reference to the accompanying drawings, which illustrate embodiments of the invention. This invention may, however, be embodied in many different forms and should not be construed as limited to the illustrated embodiments set forth herein. Rather, these embodiments are provided so that this disclosure will be thorough and complete, and will fully convey the scope of the invention to those skilled in the art. Like numbers refer to like elements throughout. Prime notation, if used, indicates similar elements in alternative embodiments.

Goodwin, Butler "Theory of Diamond CVD" in the Handbooks of Industrial Diamonds, ed. M. A. Prelas et al. 1998, on page 542 in section 2.4.1 entitled "Diffusive vs. Convective Transport" introduces the Peclet number "Pe=UL/D," where L is a characteristic scale of the reactor, U is a characteristic velocity, D is the diffusion coefficient. If Pe<<1, then the transport occurs primarily by diffusion, and the flux of species to the substrate is essentially independent of the bulk gas velocity. In the other limit, Pe>>1, species transport is primarily by convection. In this case, diffusive transport is limited to the thin boundary layer that forms over the substrate, in which the gas velocity, temperature, and species concentrations vary sharply. In the convective case, the transport of species is highly dependent on the velocity field in the reactor.

Combustion and arcjet diamond deposition systems (which are non-optimal for high quality, transparent diamond films) operate in the high-Pe convective mode. In these cases, the atomic hydrogen and other reactive species required for diamond deposition are generated in the throat of a nozzle, where extremely high temperatures enable generation of the species despite a very short residence time. The direct contact of the reactive species with the wall of the nozzle is one of the factors that can lead to erosion of the nozzle walls and contamination of the growing diamond film. As noted previously, low pressure hot-filament and conventional electrodeless microwave reactors generally operate in the low-Pe diffusive mode.

Beneficially, embodiments of the present invention, however, were developed to extend high-Pe methods to electrodeless microwave plasma diamond CVD, with Pe preferably between approximately 0.1 and 1000, and more preferably between approximately 1 and 100, even though conventional wisdom suggested that the approach would be fruitless.

The industry recognized that gas temperature in a typical microwave plasma under diamond CVD conditions is much less than that in an arcjet or a combustion flame, and therefore the rate of reactive species generation is generally much less. Accordingly, it was assumed that a shortened residence time within the plasma associated with an elevated Pe value would lead to a decrease, rather than an increase in growth rate. In addition, it was assumed that the introduction of large gas velocity gradients might have been expected to severely disrupt the operation or stability of the microwave plasma and/or the uniformity of the diamond film deposited. The fact that there are no reports of a similar attempt as set forth in the exemplary embodiments of the present invention, known to the inventors, despite the maturity of diamond CVD and of the microwave plasma method in particular and the publication of thousands of scientific papers in the field, attests to the perceived futility of such approach. Nevertheless, the inventors, through extensive analysis, discovered that a significant increase in growth rate can be realized without sacrificing either plasma stability or film uniformity or quality.

As part of the foregoing identified extensive analysis, different discharge gas flow director configurations for delivering the acting gases into a microwave plasma chamber of a microwave reactor were found to achieve different flow patterns within the microwave cavity. A number of jet/injection nozzle geometries forming various gas flow patterns, and a number of gas flow conditions, were analyzed. Significant variables included a number of nozzles, nozzle direction, location of nozzle, frequency of gas delivery, diameter of nozzle, and nozzle exit velocity. Growth process conditions were also varied. Growth rate and film uniformity were found to be impacted by the number of nozzles, nozzle location and orientation, and diameter of nozzle. A change to any of these parameters changed the gas flow pattern within the reactor, and thus, the growth characteristics of the film. Some conditions substantially increased growth rate and uniformity, where others gave poor uniformity results.

Optimized nozzle configurations were found that not only improved growth rate, but that also achieved a reasonable uniformity of deposition on a flat substrate—especially desirable characteristics for growing thick thermal management grade and optical quality diamond films. For example, as will be described in more detail below, in one preferred configuration of the nozzle assembly, each of a plurality of nozzles were positioned to provide gas flow into the microwave chamber, upstream of the plasma discharge, and oriented such that the gas flow from each nozzle were directed at a substrate from above, such that multiple directed gas streams or jets emanating from the nozzles interact with one another and the plasma discharge at some point above the substrate to create unique growth conditions that showed both good uniformity and increased growth rate as compared to a system without such directed gas flow.

Note, the phrase "directed gas flow" as used herein generally refers to an established condition whereby flow gas is set to exit a nozzle or other flow director with a velocity that is sufficiently high enough that it enters the microwave plasma chamber as a substantially focused stream of gas, for example, flowing towards the substrate, as opposed to substantially diffusing upon entry into the microwave chamber. Note also, the term "optical quality" is generally considered to mean a diamond film quality characterized, for example, by an optical absorption coefficient less than 1.05 $cm^{-1}$ in the long-wave infrared (LWIR) range, i.e., generally between approximately 7 to 14 micrometers (the atmospheric window), down to between approximately 8 to 12 micrometers. Note also, "thermal management grade" is generally considered to mean a diamond film with a thermal conductivity greater than or equal to 1000 W/m K (1000 watts per Kelvin-meter).

FIG. 1 illustrates an example of an apparatus 30 to form high quality thermal management grade and optical quality diamond films 31 when appropriate growth parameters are employed. Apparatus 30 can include an electrodeless microwave plasma reactor 33 including a tuned microwave plasma chamber 35 configured to contain reactant gases and/or carrier gas excited by microwaves to generate a microwave plasma discharge 37, and configured to contain, e.g., a silicon substrate 39, used in forming the diamond film 31. The microwave plasma chamber 35 includes at least one, but preferably a plurality of reactant gas injection ports 41 each positioned through a proximal end portion 43 of the plasma chamber 35 at a spaced apart location substantially upstream of the microwave plasma discharge 37, when generated, and above an operational surface 45 of the substrate 39, when operably positioned within the plasma chamber 35. The microwave plasma chamber 35 further includes at least one, but preferably a plurality of exhaust gas pump ports 47 each positioned through a proximal end portion 49 of the plasma chamber 35 at a spaced apart location downstream of the microwave plasma discharge 37, below the operational surface 45 of the substrate 31.

The apparatus 30 also includes a microwave generator assembly 51 including a waveguide 53 positioned at the distal end portion 49 of the plasma chamber 35 and in communication therewith to generate the microwave plasma discharge 37 at a location of the substrate 31.

The apparatus 30 further includes a gas flow director assembly 61 including at least one, but preferably a plurality of gas flow directors, e.g., directed gas jet injection nozzles 63, connected to or otherwise interfaced with the gas injection ports 41 to form a directed gas stream 65 of reactant (feed) gas. The reactant gas injected through the injection nozzles 63 contains both a carrier gas (e.g., hydrogen or argon), and a carbon precursor (e.g., methane, methyl, acetylene, and/or ethynyl), combined prior to discharge from the injection nozzles 63 and entry within the plasma chamber 35. Each of the injection nozzles 63 are configured to impart substantial kinetic energy to the respective directed gas stream sufficient to disturb a boundary layer above the substrate 39 to thereby increase an impingement rate of reactant material on the substrate 39. Beneficially, such increased impingement rate can result in a substantial increase in growth rate of deposited diamond to provide a growth rate of products between 1 to 10 microns per hour and to a film thickness of between approximately 100 and 1200 microns, as desired, for example, when under process conditions characterized by a hydrogen flow rate of between approximately 0.1 and 2 standard liters per minute, a carbon precursor, e.g., methane, flow rate of 0.1 and 4 percent of the hydrogen, a chamber pressure of between approximately 50 and 200 Torr, and a substrate temperature of between approximately 780 and 1200 degrees Centigrade.

Note, when the flow director assembly 61 is configured with a single gas injection nozzles 63, the single gas injection nozzle 63 is preferably positioned above, and normal to, the substrate 45, but may be positioned in other orientations, such as, for example, at an acute angle. Note also, although the gas flow director assembly 61 need only include such single directed gas injection nozzle 63, as will be described below, having multiple gas jet nozzles 63 can provide a synergistic effect over that of a single nozzle 63.

Figure 2:
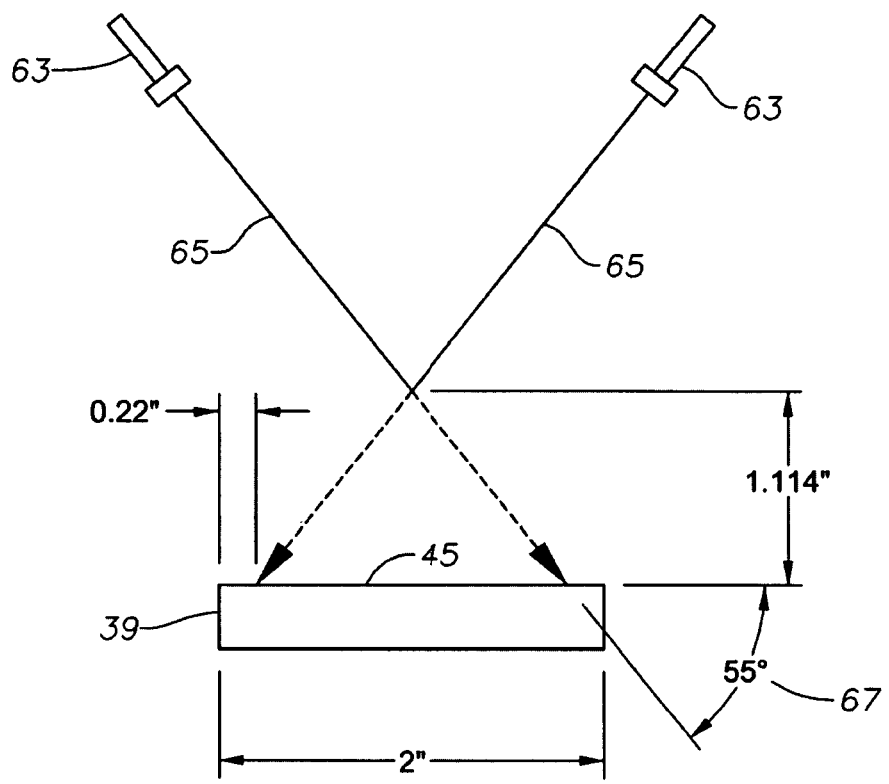
FIG. 2 is a schematic diagram illustrating relative injection nozzle orientations according to an embodiment of the present invention.

As perhaps best shown in FIG. 2, in an embodiment of the apparatus 30 having multiple injection nozzles 63, the injection nozzles 63 can be oriented so that the directed gas streams 65 of reactant gas interact with each other, for example, at a location above the operational surface 45 of the substrate 39. Specifically, each directed gas stream provided by the nozzles 63 is oriented to interact with at least one other directed gas stream and with the plasma discharge 37 (see FIG. 1), when generated, to thereby enhance growth rate of diamond film 31 (see FIG. 1) on the substrate 39 while maintaining substantial uniformity of the diamond film 31.

As shown in FIGS. 1 and 2, according to a preferred configuration, at least three, but preferably at least four gas jet injection nozzles 63 are spaced substantially evenly apart within a same plane and oriented at a substantially same acute angle 67 with respect to the operational surface 45 of the substrate 39 to thereby further improve uniformity and to manage a shape of the plasma discharge 37, e.g., intensifying and flattening the hemispherical shape of the plasma discharge 37, increasing the concentration of reaction species in close proximity to the operational surface 45 of the substrate 39. According to a preferred configuration, the in-plane injection nozzles 63 have a length of between approximately 0.1 and 4.0 inches and an inner aperture diameter of between approximately 0.030 and 0.04 inches.

The in-plane gas jet injection nozzles 63 are preferably positioned at an angle of approximately 50 and 60 degrees to the operational surface 45 of the substrate 39, and more preferably at an angle of approximately 55 degrees, so that a longitudinal axis of the each in-plane gas jet injection nozzle 63 extends to a location on the operational surface 45 of the substrate 39 positioned between approximately 9 and 13 percent of a length of the operational surface 45 of the substrate 39. In the example shown in FIG. 2 illustrating a 2.0 inch substrate 39, the nozzles 63 are directed to a point of approximately 0.22 inches from an edge of the substrate 39 to intersect at a point approximately 1.114 inches above the operational surface 45 of the substrate 39.

As shown in FIG. 1, an additional gas jet injection nozzle 63 can be positioned upstream of the plasma discharge 35 and above the operational surface 45 of the substrate 39 and at an angle approximately normal to the operational surface 45 of the substrate 39. Beneficially, the position and orientation of various combinations of the nozzles 63, the position of the exhaust gas ports 47, and the position of the microwave waveguide 53, contribute substantially to maintaining the generated microwave plasma discharge 37 in contact with the substrate 39.

Figure 3:
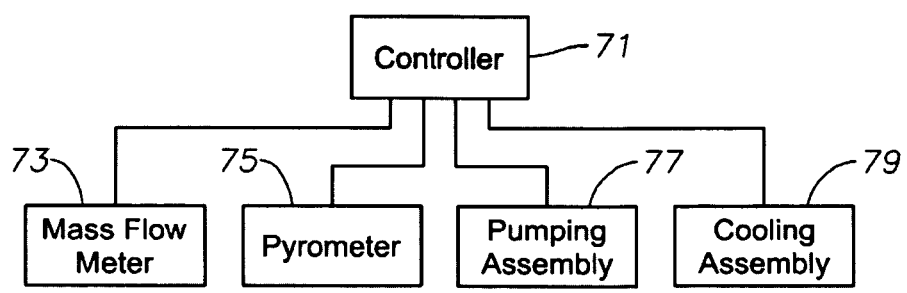
FIG. 3 is a schematic diagram illustrating a control portion of an apparatus for forming a diamond film according to another embodiment of the present invention.

As shown in FIG. 3, according to an embodiment of the present invention, the apparatus 30 can also include various control components which provide management of process conditions to thereby provide for the enhanced diamond film growth rate while maintaining the uniformity. For example, a controller 71 configured to control a flow rate of the gas entering the plasma chamber 35, a velocity of gas exiting each nozzle 63, the flow and pressure of a cooling assembly 79, and a pressure within the chamber 35, is provided, to thereby control the shape of the plasma discharge 37, temperature within the chamber 35 as measured by a pyrometer 75, and the deposition rate of the reactant material. Note, the control logic of controller 71 can be implemented either in hardware or in software/program product as known and understood by those skilled in the art of computer science.

The apparatus 30 can also include a mass flow meter 73, a pyrometer 75, a pumping assembly 77, and a cooling assembly 79, each in communication with the controller 71. The mass flow meter 73 is positioned to meter the reactant gas entering the nozzles 63, and thus, the mass flow entering the plasma chamber 35, and to provide mass flow rate data to the controller 71. According to the exemplary configuration, the gas entering the plasma chamber 35 is managed to have an operational flow rate of between approximately 0.1 and 2.0, and more preferably, between approximately 0.3 and 1 standard liters per minute, with a level of carbon precursor (e.g., methane, methyl, acetylene, and/or ethynyl) at between approximately 0.1 and 4.0 percent, and more preferably, between approximately 0.5 and 4.0 percent, and managed, for example, to provide a nozzle injection exit velocity of between approximately 10 m/sec and 300 m/sec for each nozzle 63.

The pyrometer 75 is positioned to measure temperature within the plasma chamber 35 during operation of the apparatus to provide temperature data to the controller 71. According to the exemplary configuration, the operational temperature of the plasma discharge 37 is maintained so that the substrate temperature is maintained between approximately 780 and 1200 degrees centigrade, and more preferably, between approximately 840 and 970 degrees centigrade.

The pumping assembly 77 is connected to, or otherwise interfaced with, the exhaust gas ports 47 to extract gas from within the plasma chamber 35 to maintain a desired pressure within the plasma chamber 35, and to provide pressure data to the controller 71. According to the exemplary configuration, the operational pressure maintained within the plasma chamber 35 is between approximately 50 and 200 Torr.

The cooling assembly 79 is positioned to maintain temperature uniformity within the plasma chamber 35 to thereby maintain such temperature uniformity for the diamond film 31 and substrate 39 during operation of the apparatus 30.

According to an embodiment of the apparatus 30 having various combinations of a hydrogen flow rate of between approximately 0.1 and 2.0 with a level of carbon precursor (e.g., methane, methyl, acetylene, and/or ethynyl) at between approximately 0.1 and 4.0 percent, a nozzle injection exit velocity of between approximately 10 m/sec and 300 m/sec for each nozzle 63, an operational temperature of between approximately 780 and 1200 degrees centigrade, and an operational pressure of between approximately 50 and 200 Torr, and using at least two nozzles positioned at an angle of between approximately 50 and 60 degrees, growth rates of up to at least 10 microns per hour can be achieved, along with a thicknesses of up to at least 1200 microns of at least thermal management quality diamond film.

According to an embodiment of the apparatus 30 having various combinations of a hydrogen flow rate of between approximately 0.3 and 1.0 with a level of carbon precursor (e.g., methane, methyl, acetylene, and/or ethynyl) at between approximately 0.5 and 4.0 percent, a nozzle injection exit velocity of between approximately 30 m/sec and 150 m/sec for each nozzle 63, a nozzle inner diameter of approximately 0.035 inches, an operational temperature of between approximately 840 and 970 degrees centigrade, and an operational pressure of between approximately 90 and 130 Torr, and using three nozzles oriented at an angle 67 of approximately 55 degrees to that of the operational surface 45 of the substrate 39, growth rates of optical quality film of between approximately 7 and 9 microns per hour can be achieved for films having a thickness of between approximately 100 and 180 microns.

Various embodiments of the present invention also include methods of forming diamond film. The conventional technique to grow high quality and uniform diamond thin films is through microwave plasma CVD methods using a microwave plasma reactor 33', such as that shown in FIG. 4. Although the key parameters to control the film quality and growth rate have strong interactions, such as, for example, microwave power density, substrate temperature, methane/other carbon precursor percentage with respect to hydrogen flow and reaction chamber pressure etc., the hydrogen flow rate is typically kept quite low, for example, within a range of approximately 50-600 sccm, and it is understood to have a limited or no interaction with those key parameters. In the conventional reactor 33', the purpose of slow hydrogen flux is primarily to not disturb the combustion chemistry inside the plasma ball 37', otherwise growth species such as hydrogen atoms and methyl radicals would be expected to have an uneven distribution over the substrate surface area and thereby result in a significant non-uniform growth of diamond film. Beneficially, various embodiments of the present invention employ application of gas flow dynamics (e.g., gas convection and modified gas flow patterns) through modified nozzle configurations to enhance the quality of CVD diamond film over a, e.g., silicon substrate, in terms of crystal morphology, growth rate and thickness uniformity.

Figure 5:
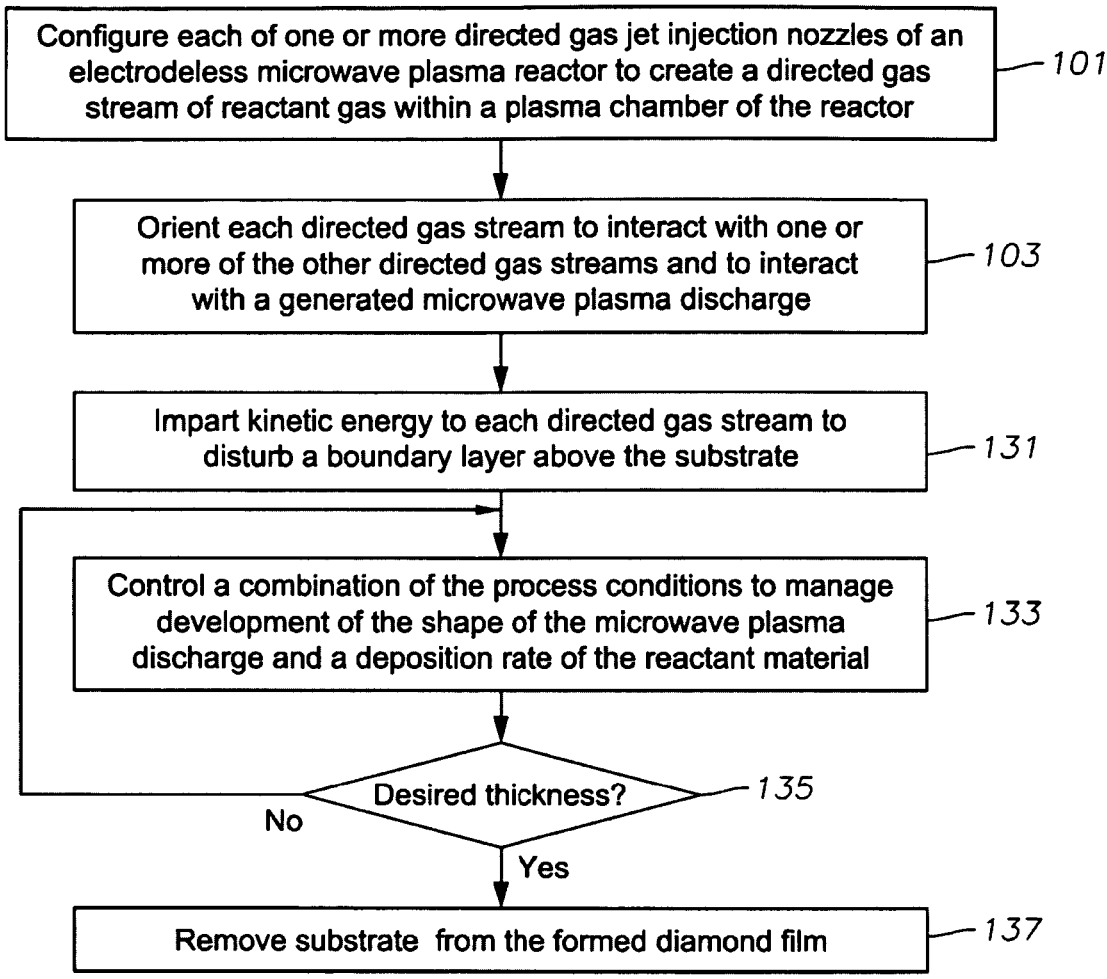
Figure 6:
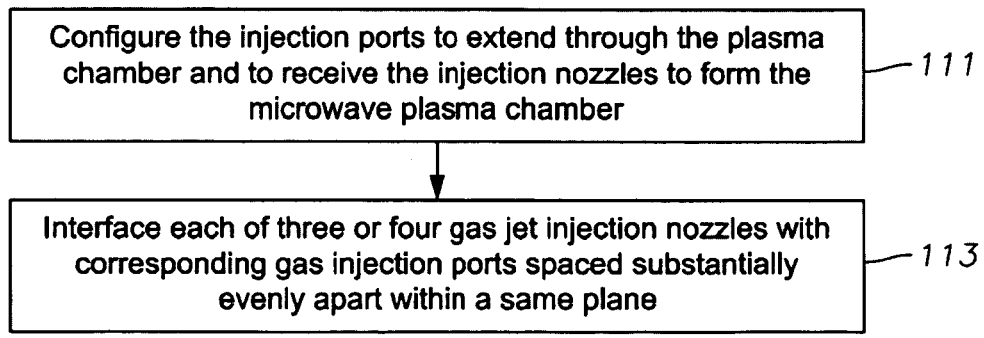

FIGS. 5-7 illustrate an example of a method for forming diamond film 31, according to an embodiment of the present invention. As perhaps best shown in FIGS. 2 and 5, the method can include configuring each of one or more directed gas jet injection nozzles 63 of an electrodeless microwave plasma reactor 33 to create a directed gas stream 65 of reactant gas within a microwave plasma chamber 35 of the reactor 33 (block 101), and orienting each directed gas stream 65 to interact with one or more of the other directed gas streams (in a multi nozzle configuration) and to interact with a microwave plasma discharge 37 when generated within the plasma chamber 35 (block 103) to thereby enhance the growth rate of a diamond film 31 on an operational surface 45 of a substrate 39, while maintaining substantial uniformity of the film 31.

As shown in FIGS. 2 and 6, the steps of configuring the injection nozzles 41 can include forming the microwave plasma chamber 35 by configuring a plurality of reactant gas injection ports 41 to extend therethrough and to receive a separate one of the directed gas jet injection nozzles 63 (block 111). If an existing off-the-shelf plasma chamber 35' is utilized (see, e.g., FIG. 4), such can include either modifying the size or shape of existing window ports 41' to form the desired injection ports 41, closing one or more of such ports 41' and originating a separate set of injection ports 41 at a location substantially upstream of a location of the microwave plasma discharge 37 when generated and above the operational surface 45 of the substrate 39, e.g., adjacent the window ports 41', or forming the ports 41 through a combination of modifying one or more of the window ports 41' and originating one or more new ports 41. The step of configuring can further include interfacing each of preferably three or four gas jet injection nozzles 63 with a corresponding three or four of the gas injection ports 41 that are spaced substantially evenly apart, and preferably within in a same plane (block 113).

As shown in FIGS. 2 and 7, the step of orienting the directed gas streams 65 can include orienting each of the in-plane injection nozzles 63 at a substantially same acute angle with respect to the operational surface of the substrate to improve uniformity and manage a shape and intensity of the microwave plasma discharge 37 and to increase the concentration of reaction species in close proximity to the substrate 39 (block 121). The step of orienting can also optionally include interfacing an additional injection nozzle 63 with a gas injection port 41 positioned upstream of the microwave plasma discharge 37 and substantially above the substrate 39, e.g., a center of the operational surface 45 of the substrate 39 (block 123), and orienting the additional injection nozzle 63 at an angle approximately normal to the operational surface 45 of the substrate 39 (block 125) as shown, for example, in FIG. 1.

As further shown in FIGS. 2 and 5, the method can also include imparting substantial kinetic energy to each directed gas stream sufficient to disturb a boundary layer above the substrate 39 to thereby increase an impingement rate of reactant material, such as, for example, the atomic hydrogen H, the methyl radical $CH_3$, acetylene $C_2H_2$, and the ethynyl radical $C_2H$, on the operational surface 45 of the substrate 39 (block 131), and controlling a combination of the flow rate of gas entering the microwave plasma chamber 35, the velocity of gas injected from the directed gas jet injection nozzles 63 into the microwave plasma chamber, the temperature within the chamber 35, and the pressure within the chamber 35 (block 133), to thereby manage development of the shape of the microwave plasma discharge 37 and a deposition rate of the reactant material.

Once the desired thickness of the diamond film 31 is reached (block 135), the substrate 39 is then removed from the diamond film 31 (block 137), for example, by dissolution in hydrofluoric acid. The freestanding diamond film layer 31 would then be lapped and polished, and could then be processed as necessary for its intended end use.

The invention has several advantages. Various embodiments of the present invention include, for example, an apparatus 30 having nozzles positioned to direct streams 65 of reactant gas that flow into a tuned microwave cavity containing a microwave plasma discharge (e.g., plasma ball 37), such that the gas streams 65 emanating from the nozzles 63 interact with one another and the plasma ball 37 to create unique growth conditions. Advantageously, such utilization of a directed gas stream 65 of reactant gas has been found to show both good uniformity and increased growth rate as compared to a reactor without directed gas flow. According to various embodiments of the present invention, the reactant gas injection nozzles 63 are positioned upstream of the plasma discharge 37 and affect a change on that plasma as the gas flow interacts with discharge. Advantageously, such configuration results in the production favorable diamond film growth conditions. Further, according to various embodiments of the present invention, the gas flow or stream 65 from each reactant gas injection nozzle 63 is directed at the substrate 39 from above, with the multiple gas streams 65 interacting at a point above the substrate 39, to thereby advantageously affect a change on the plasma discharge 37 as the gas flow interacts with the discharge 37, without generating a spiral gas flow at any time. Advantageously, according to various embodiments of the present invention, the directed gas flow 65 interacts with the plasma discharge 37 to flatten and intensify the shape of the hemisphere above the operational surface 45 of the substrate 39, increasing the concentration of reaction species in close proximity to the substrate 39. Further advantageously, due to the nozzle configuration, shaping of the plasma discharge 37 can be made without the need for additional magnetic field generating equipment to perform such task.

In the drawings and specification, there have been disclosed a typical preferred embodiment of the invention, and although specific terms are employed, the terms are used in a descriptive sense only and not for purposes of limitation. The invention has been described in considerable detail with specific reference to these illustrated embodiments. It will be apparent, however, that various modifications and changes can be made within the spirit and scope of the invention as described in the foregoing specification. For example, although described with respect to the deposition of a diamond film, various other types of film can be readily created using the apparatus and methods described herein.

That claimed is:

1. A method for forming diamond film, the method comprising the following steps to enhance growth rate of a diamond film on an operational surface of a substrate while maintaining substantial uniformity of the film:
    configuring each of a plurality of directed gas jet injection nozzles of an electrodeless microwave plasma reactor to create a directed gas stream of reactant gas within a microwave plasma chamber of the electrodeless microwave plasma reactor;
    orienting at least three of the plurality of directed gas jet injection nozzles so that a longitudinal axis of the each gas jet injection nozzle extends to a location on the proximal surface of the substrate of between approximately 9 and 13 percent of a length of the proximal surface of the substrate; and
    orienting each directed gas stream to interact with at least one other directed gas stream and with a microwave plasma discharge when generated within the microwave plasma chamber.

2. A method as defined in claim 1, further comprising the step of:
    imparting substantial kinetic energy to each directed gas stream sufficient to substantially disturb a boundary layer above the substrate, intensifying and flattening a hemispherical shape of the microwave plasma discharge to thereby substantially increase an impingement rate of reactant material on the operational surface of the substrate, the increased impingement rate resulting in a substantial increase in growth rate of deposited film material.

3. A method as defined in claim 1,
    wherein the step of orienting each directed gas stream includes the steps of:
        configuring a plurality of reactant gas injection ports to each receive a separate one of the plurality of directed gas jet injection nozzles, each of the plurality of reactant gas injection ports extending through a proximal end portion of the microwave plasma chamber at a location substantially upstream of a location of the microwave plasma discharge when generated and above the operational surface of the substrate when operably positioned within the microwave plasma chamber,
        interfacing each of the at least three gas jet injection nozzles with a corresponding at least three of the plurality of reactant gas injection ports spaced substantially evenly apart within a same plane, and orienting each of the at least three gas jet injection nozzles at a substantially same acute angle with respect to the operational surface of the substrate to improve uniformity and manage a shape of the microwave plasma discharge.

4. A method as defined in claim 3,
wherein the step of configuring a plurality of reactant gas injection ports includes modifying a size of each of the at least three existing gas injection ports;
wherein the plurality of directed gas jet injection nozzles includes at least a fourth gas jet injection nozzles; and
wherein the step of orienting each directed gas stream further includes the steps of:
interfacing the at least a fourth gas injection nozzle with a corresponding one of the plurality of reactant gas injection ports positioned upstream of the microwave plasma discharge and substantially above a center of the operational surface of the substrate when the substrate is operably positioned within the microwave plasma chamber, and
orienting the at least a fourth gas jet injection nozzle at an angle approximately normal to the operational surface of the substrate.

5. A method as defined in claim 4,
wherein the diamond film is an optical grade diamond film;
wherein the growth rate of diamond film on the substrate is between approximately 7-9 microns per hour; and
wherein the step of configuring the electrodeless microwave plasma reactor includes configuring the reactor so that the diamond film produced by the reactor has a thickness of between approximately 100 and 180 microns at an optical quality characterized by an absorption of less than 5% at a wavelength of between approximately 7.9 and 10.6 micrometers and an absorption of less than 10% at a wavelength of between approximately 10.6 and 12.0 micrometers.

6. A method as defined in claim 5, further comprising the step of:
controlling a combination of a flow rate of gas entering the microwave plasma chamber, a velocity of gas injected from each of the plurality of directed gas jet injection nozzles into the microwave plasma chamber, a temperature within the chamber, and a pressure within the chamber to thereby control a shape of the microwave plasma discharge and a concentration of reactant species in close proximity to the operational surface of the substrate.

7. A method for forming diamond film, the method comprising the steps of:
configuring a plurality of directed gas jet injection nozzles of an electrodeless microwave plasma reactor to create a directed gas stream of reactant gas within a microwave plasma chamber of the electrodeless microwave plasma reactor, each of the plurality of directed gas jet injection nozzles configured to form a directed gas stream of reactant gas;
positioning at least three of the plurality of directed gas jet injection nozzles at an angle of between approximately 50 and 60 degrees to a proximal surface of an operational surface of a substrate for growing film so that a longitudinal axis of the each gas jet injection nozzle extends to a location on the proximal surface of the substrate of between approximately 9 and 13 percent of a length of the proximal surface of the substrate;
orienting each directed gas stream to interact with at least one other directed gas stream and with the microwave plasma discharge when generated within the microwave plasma chamber to thereby enhance growth rate of the film on the operational surface of a substrate while maintaining substantial uniformity of the film;
imparting substantial kinetic energy to the directed gas stream sufficient to disturb a boundary layer above the substrate, intensifying and flattening a hemispherical shape of the microwave plasma discharge, to thereby increase an impingement rate of reactant material on the operational surface of the substrate, the increased impingement rate resulting in a substantial increase in growth rate of deposited film material;
configuring a controller to control a flow rate of gas entering the microwave plasma chamber, a velocity of gas exiting each directed gas jet nozzle, and a pressure within the chamber to thereby control a shape of the microwave plasma discharge and a deposition rate of the reactant material, and to monitor temperature within the chamber;
positioning a mass flow meter to meter the reactant gas entering each of the plurality of directed gas jet nozzles and in communication with the controller to provide mass flow rate data thereto;
positioning a pyrometer to measure temperature within the microwave plasma chamber during operation of the electrodeless microwave plasma reactor and in communication with the controller to provide temperature data thereto; and
maintaining temperature uniformity on at least one of the diamond film and substrate temperature during operation of the electrodeless microwave plasma reactor.

8. A method as defined in claim 7, further comprising the step of:
positioning a microwave generator assembly in communication with the microwave plasma chamber to generate the microwave plasma discharge at a location of the substrate within the microwave plasma chamber.

9. A method as defined in claim 8,
wherein the plurality of directed gas jet nozzles are each interfaced with a respective one of a plurality of reactant gas injection ports in a proximal end portion of the microwave plasma chamber, and oriented to interact with each other at a location above the operational surface of the substrate when the substrate is operably positioned within the microwave plasma chamber; and
wherein the method further comprises the step of positioning a microwave generator assembly waveguide at a distal end portion of the microwave plasma chamber to thereby form the microwave plasma discharge at the location of the substrate, downstream of the plurality of directed gas jet nozzles.

10. A method as defined in claim 7, wherein the plurality of directed gas jet nozzles include at least three gas jet injection nozzles, wherein each of the at least three gas jet injection nozzles have a length established at between approximately 0.1 and 4.0 inches, and wherein each of the at least three gas jet injection nozzles have an inner aperture diameter established at between approximately 0.030 and 0.04 inches, the method further comprising the steps of:
interfacing each of the at least three gas jet injection nozzles with a respective one of a plurality of reactant gas injection ports in a proximal end portion of the microwave plasma chamber; and
orienting each of the at least three gas jet injection nozzles to interact with each other at a location above an operational surface of the substrate, to include spacing the at least three gas jet injection nozzles substantially evenly apart within a same plane and oriented at a substantially same acute angle with respect to a proximal surface of the substrate of between approximately 50 and 60 degrees to the proximal surface of the substrate to thereby provide for a growth rate of diamond film on the substrate of between approximately 5 and 10 microns per hour.

11. A method as defined in claim 10, further comprising the steps of:
establishing the velocity of gas exiting each gas jet injection nozzle at between approximately 10 and 300 meters per second;
establishing an operational flow rate of the reactant gas entering the microwave plasma chamber at between approximately 0.3 and 1 standard liters per minute;
establishing a composition of the reactant gas at between approximately 0.5 and 4 percent carbon precursor;
establishing an operational temperature of the substrate at between approximately 780 and 1200 degrees Centigrade; and
establishing an operational pressure within the microwave plasma chamber at between approximately 50 and 200 Torr.

12. A method for forming diamond film, the method comprising the steps of:
configuring at least one directed gas jet injection nozzle of an electrodeless microwave plasma reactor to create a directed gas stream of reactant gas within a microwave plasma chamber of the electrodeless microwave plasma reactor, wherein the at least one directed gas jet nozzle includes a plurality of directed gas jet nozzles, each configured to form a directed gas stream of reactant gas, wherein the plurality of directed gas jet nozzles include at least three gas jet injection nozzles, wherein each of the at least three gas jet injection nozzles have a length established at between approximately 0.1 and 4.0 inches, and wherein each of the at least three gas jet injection nozzles have an inner aperture diameter established at between approximately 0.030 and 0.04 inches;
orienting each of the at least three gas jet injection nozzles to interact with each other at a location above an operational surface of the substrate, to include spacing the at least three gas jet injection nozzles substantially evenly apart within a same plane and orienting each of the at least three gas jet injection nozzles at an acute angle with respect to a proximal surface of the substrate of between approximately 50 and 60 degrees to the proximal surface of the substrate so that a longitudinal axis of the each gas jet injection nozzle extends to a location on the proximal surface of the substrate of between approximately 9 and 13 percent of a length of the proximal surface of the substrate to thereby provide for a growth rate of diamond film on the substrate of between approximately 7 and 9 microns per hour;
orienting each directed gas stream to interact with at least one other directed gas stream and with the microwave plasma discharge when generated within the microwave plasma chamber to thereby enhance growth rate of a film on an operational surface of a substrate while maintaining substantial uniformity of the film;
interfacing each of the at least three gas jet injection nozzles with a respective one of a plurality of reactant gas injection ports in a proximal end portion of the microwave plasma chamber; and
imparting substantial kinetic energy to the directed gas stream sufficient to disturb a boundary layer above the substrate, intensifying and flattening a hemispherical shape of the microwave plasma discharge, to thereby increase an impingement rate of reactant material on the operational surface of the substrate, the increased impingement rate resulting in a substantial increase in growth rate of deposited film material, the diamond film produced by the electrodeless microwave plasma reactor having a thickness of between approximately 100 μm and 5 mm at an optical quality characterized by an absorption coefficient less than 1.05 cm$^{-1}$ at an electromagnetic wavelength between 7 to 14 μm.

13. A method as defined in claim 12, further comprising the steps of:
establishing the velocity of gas exiting each gas jet injection nozzle at between approximately 10 and 300 meters per second;
establishing an operational flow rate of the reactant gas entering the microwave plasma chamber at between approximately 0.3 and 1 standard liters per minute;
establishing a composition of the reactant gas at between approximately 0.5 and 4 percent carbon precursor;
establishing an operational temperature of the substrate at between approximately 780 and 1200 degrees Centigrade; and
establishing an operational pressure within the microwave plasma chamber at between approximately 50 and 200 Torr.

14. A method for forming large diameter high quality diamond film while maintaining substantial uniformity of the diamond film, the method comprising the steps of:
providing a microwave plasma reactor with a substrate positioned within a microwave plasma chamber;
establishing an operational flow rate of reactant gas entering the microwave plasma chamber;
establishing an operational temperature of the substrate at between approximately 780 and 1200 degrees Centigrade;
establishing an operational pressure within the microwave plasma chamber at between approximately 50 and 200 Torr;
generating a microwave plasma discharge within the microwave plasma chamber immediately proximate to the substrate;
configuring a plurality of directed gas jet injection nozzles each to create a directed gas stream of reactant gas substantially toward the substrate within the microwave plasma chamber of the microwave plasma reactor, the plurality of directed gas jet nozzles comprising at least three gas jet nozzles, the at least three gas jet nozzles being positioned at an angle of between approximately 50 and 60 degrees to a proximal surface of the substrate so that a longitudinal axis of the each gas jet injection nozzle extends to a location on the proximal surface of the substrate positioned between approximately 9 and 13 percent of a length of the proximal surface of the substrate, each directed gas stream oriented so as to interact with the microwave plasma discharge to provide an enhance growth rate of diamond film on the substrate;
directing the gas stream of reactant gas for each of the directed gas jet injection nozzles toward the substrate to interact with the microwave plasma discharge; and
forming a diamond film having substantial uniformity on an operational surface of the substrate responsive to the combination of steps of establishing the respective operational substrate temperature of between approximately 780 and 1200° C., establishing the respective operational microwave plasma chamber pressure of between approximately 50-200 Torr, generating the microwave plasma discharge proximate the substrate, and directing the gas stream of reactant gas cause interaction of the directed gas streams with the microwave plasma discharge proximate the substrate while maintaining the respective operational substrate temperature and operational microwave plasma chamber pressure.

15. A method as defined in claim 14, wherein step of forming a diamond film having substantial uniformity on an operational surface of the substrate comprises forming a diamond film having a diameter of at least 2 inches on the operational surface of the substrate while maintaining substantial uniformity.

16. A method as defined in claim 14, wherein each of the plurality of directed gas streams is oriented to interact with at least one other directed gas stream of the plurality of directed gas streams and with the microwave plasma discharge when generated within the microwave plasma chamber to thereby enhance growth rate of the diamond film on an operational surface of the substrate while maintaining substantial uniformity of the diamond film.

17. A method as defined in claim 16,
wherein the plurality of directed gas jet injection nozzles includes at least three gas jet injection nozzles; and
wherein the step of orienting each directed gas stream includes the steps of:
configuring a plurality of reactant gas injection ports to each receive a separate one of the plurality of directed gas jet injection nozzles, each of the plurality of reactant gas injection ports extending through a proximal end portion of the microwave plasma chamber at a location substantially upstream of a location of the microwave plasma discharge when generated and above the operational surface of the substrate,
interfacing each of the at least three gas jet injection nozzles with a corresponding at least three of the plurality of reactant gas injection ports spaced substantially evenly apart within a same plane, and
orienting each of the at least three gas jet injection nozzles at a substantially same acute angle with respect to the operational surface of the substrate to improve uniformity and manage a shape of the microwave plasma discharge.

18. A method as defined in claim 17,
wherein the step of configuring a plurality of reactant gas injection ports includes modifying a size of each of at least three existing gas injection ports;
wherein the plurality of directed gas jet injection nozzles includes at least a fourth gas jet injection nozzles; and
wherein the step of orienting each directed gas stream further includes the steps of:
interfacing the at least a fourth gas injection nozzle with a corresponding one of the plurality of reactant gas injection ports positioned upstream of the microwave plasma discharge and substantially above a center of the operational surface of the substrate when the substrate is operably positioned within the microwave plasma chamber, and
orienting the at least a fourth gas jet injection nozzle at an angle approximately normal to the operational surface of the substrate.

19. A method as defined in claim 16, further comprising the steps of:
establishing the velocity of gas exiting each gas jet injection nozzle at between approximately 30 and 150 meters per second; and
establishing a composition of the reactant gas at between approximately 0.5 and 4 percent carbon precursor with respect to hydrogen.

20. A method as defined in claim 19, further comprising the steps of:
establishing an operational flow rate of the reactant gas entering the microwave plasma chamber at between approximately 0.3 and 1 standard liters per minute.

21. A method as defined in claim 16,
wherein the diamond film is a thermal management grade diamond film;
wherein the growth rate of diamond film on the substrate is greater than approximately 7 microns per hour; and
wherein the step of configuring the microwave plasma reactor includes configuring the reactor so that the diamond film produced by the reactor has a thickness of greater than approximately 100 microns and a thermal conductivity above about 1000 W/Kelvin-meter.

22. A method as defined in claim 16,
wherein the diamond film is an optical grade diamond film;
wherein the growth rate of diamond film on the substrate is greater than approximately 7 microns per hour; and
wherein the step of configuring the microwave plasma reactor includes configuring the reactor so that the diamond film produced by the reactor has a thickness of greater than approximately 100 microns and an optical quality characterized by an absorption of less than 5% at a wavelength of between approximately 7.9 and 10.6 micrometers and an absorption of less than 10% at a wavelength of between approximately 10.6 and 12.0 micrometers.

23. A method as defined in claim 16, wherein the plurality of directed gas jet nozzles include at least three gas jet injection nozzles, wherein each of the at least three gas jet injection nozzles have a length established at between approximately 0.1 and 4.0 inches, and wherein each of the at least three gas jet injection nozzles have an inner aperture diameter established at between approximately 0.030 and 0.04 inches, the method further comprising the steps of:
interfacing each of the at least three gas jet injection nozzles with a respective one of a plurality of reactant gas injection ports in a proximal end portion of the microwave plasma chamber; and
orienting each of the at least three gas jet injection nozzles to interact with each other at a location above an operational surface of the substrate, to include spacing the at least three gas jet injection nozzles substantially evenly apart within a same plane and oriented at a substantially same acute angle with respect to a proximal surface of the substrate of between approximately 50 and 60 degrees to the proximal surface of the substrate to thereby provide for a growth rate of the diamond film on the substrate between approximately 5 microns per hour and approximately 10 microns per hour.

* * * * *